(12) United States Patent
Dumoulin et al.

(10) Patent No.: US 6,940,282 B2
(45) Date of Patent: Sep. 6, 2005

(54) SWITCHABLE TRANSMIT ARRAY COIL (75) Inventors: Charles Dumoulin, Ballston Lake, NY (US); Randy Giaquinto, Burnt Hills, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 10/741,578

(22) Filed: Dec. 19, 2003

(65) Prior Publication Data
US 2005/0134270 A1    Jun. 23, 2005

(51) Int. Cl.[7] .............................................. G01V 3/00
(52) U.S. Cl. ...................... 324/318; 324/319
(58) Field of Search .............................. 324/318, 322, 324/307, 309, 300, 319; 600/422

(56) References Cited

U.S. PATENT DOCUMENTS

| | | | | |
|---|---|---|---|---|
| 3,571,659 A | * | 3/1971 | Anzai et al. | 361/55 |
| 6,211,677 B1 | * | 4/2001 | Burl et al. | 324/322 |
| 6,297,636 B1 | * | 10/2001 | Shimo et al. | 324/318 |
| 6,445,181 B1 | * | 9/2002 | Pelc et al. | 324/307 |
| 6,549,799 B2 | * | 4/2003 | Bock et al. | 600/422 |
| 6,552,544 B2 | * | 4/2003 | Wong et al. | 324/318 |
| 6,563,315 B1 | * | 5/2003 | Boskamp et al. | 324/318 |

* cited by examiner

*Primary Examiner*—Brij B. Shrivastav
(74) *Attorney, Agent, or Firm*—Fletcher Yoder (57) ABSTRACT

A magnetic resonance imaging system comprises an array of radio frequency (RF) coils for producing controlled RF fields applying excitation signals to a volume of interest and a coil control circuitry configured to excite a single coil from the array of radio frequency coils at a given instant of time, where neighboring coils in the array are deactivated for the given instant of time.

36 Claims, 5 Drawing Sheets

SWITCHABLE TRANSMIT ARRAY COIL

BACKGROUND OF THE INVENTION

The invention relates generally to Magnetic Resonance Imaging (MRI) and more specifically to a switchable transmit array coil for reducing radio frequency (RF)-induced heating during interventional MR procedures.

Magnetic Resonance Imaging (MRI) is a non-invasive imaging technique, in which the imaged subject is kept in a static main magnetic field, known as the B0 field and the nuclei of the imaged subject are excited by the radio frequency (RF) field known as the B1 field, in the presence of gradient fields. The gradient fields permit location and selection of volume elements (voxels) to be imaged. For certain MRI systems, a single radio frequency coil is used to transmit the RF energy to the nuclear magnetic moments, as well as to receive the extremely small nuclear magnetic resonance signal that come back from the subject. The signals, referred to as magnetic resonance signals, result from reorientation of certain gyromagnetic materials of the subject, whose molecules spin or precess at characteristic frequencies. Large radio frequency coils, typically called body coils are commonly employed to image the whole body, head and limb imaging in medical applications.

When a long conducting structure such as a guidewire is placed in an MR imaging magnet and exposed to the high electromagnetic fields (E-fields) generated by a body coil, high E-fields can be generated at the end of the conductor. If the end of this conductor is surrounded by conducting tissue (e.g. muscle, blood vessel wall, blood) these high E-fields can induce electrical currents in the tissue. These currents in turn can local heating of the tissue, while the device itself does not heat up appreciably.

There are several important characteristics of RF-induced heating associated with conducting structures. First, the heating is proportional to the RF power that is applied. Thus, since the RF power required to induce a selected nutation in spin magnetization is proportional to the square of the static magnetic field of the scanner, the heat that is created for a given imaging protocol will be (to the first approximation) proportional to the square of the imaging field strength. RF-induced heating is also proportional to the specific absorption rate (SAR) of the imaging protocol. SAR is the rate at which RF energy is dissipated in tissue per unit mass of tissue. Low SAR scans will induce less heating. SAR is a useful metric for non-localized heating, but it is possible to have undesirable amounts of heat in a localized volume even when the SAR is very low.

A second characteristic of RF-induced heating comes from the fact that the MR excitation frequency is proportional to the strength of the static magnetic field. Consequently, the wavelength of the RF excitation decreases at higher field strengths and the coupling of the excitation coils E-field to a conducting structure within the magnet is increased. This dependency on wavelength implies that the RF-induced heating is proportional to a factor that is larger than the square of the field strength.

Since the RF-induced heating described here is related to the E-fields created by the transmit coil, the spatial variations in E-fields created by a selected transmit coil geometry will have a substantial effect on RF-induced heating. The largest coil in an MR imaging system is the body coil which is typically built into the wall of the MR scanner bore. With a birdcage body coil design, the E-field is zero along the center axis of the coil and increases linearly in the radial direction towards the elements of the coil. Thus, long conducting structures placed along the center axis of the magnet will exhibit little heating. Long conducting structures placed along the edge of the magnet bore, however, have the potential for substantial RF-heating.

Small devices such as biopsy needles (e.g. 35 cm long) do not exhibit RF-induced heating in the conventional 1.5 Tesla scanners widely used today. Longer devices such as conducting guidewires, however can generate greater amounts of heat under certain conditions at 1.5 Tesla, but do not appear to be able to generate similar amounts of heat under the same conditions at 0.5 Tesla.

Several methods for the reduction of RF-induced heating have been proposed. For example, RF-traps are used in the construction of devices to present high impedance to common-mode currents. This approach redistributes the E-field within the device to reduce the heating at the device tip. The incorporation of an RF trap aids to some degree, but adds to the complexity of the device and may be physically impossible for thinner devices such as guidewires.

One of the limitations of all previous attempts to reduce RF-heating is that they address the device and not the source of the heating. Even if a reduction method is very effective in reducing RF-induced device heating, these solutions are not very effective because a naïve operator can always accidentally use a device that does not incorporate the specific feature for heat reduction.

Consequently, an approach to reduce RF-induced heating is required that is independent of the device, so that RF-induced heating will be minimized for all devices used in the MR system whether or not they were designed for MRI.

BRIEF DESCRIPTION OF THE INVENTION

Briefly in accordance with one embodiment of the invention, a magnetic resonance imaging (MRI) system includes an array of radio frequency (RF) coils for producing controlled RF field applying excitation signals to a volume of interest. The MRI system also includes a coil control circuitry configured to excite a single coil from the array of radio frequency coils at a given instant of time. The neighboring coils in the array are deactivated for the given instant of time.

In accordance with a technique of the invention, a method for reducing radio frequency (RF)-induced heating during interventional MR procedures, the method includes providing an array of radio frequency coils for producing controlled RF field applying excitation signals to a volume of interest, selecting an imaging slice within a volume of interest being imaged, acquiring a plurality of images at the selected image slice by exciting each coil in the array, where a single coil is excited at a given instant of time and produces a single image and reconstructing the plurality of images into a reconstructed image, wherein the reconstructed image has a larger field-of-view than the single image from the single coil.

BRIEF DESCRIPTION OF THE DRAWINGS

The foregoing and other advantages and features of the invention will become apparent upon reading the following detailed description and upon reference to the drawings in which.

DETAILED DESCRIPTION OF SPECIFIC EMBODIMENTS

Figure 1:
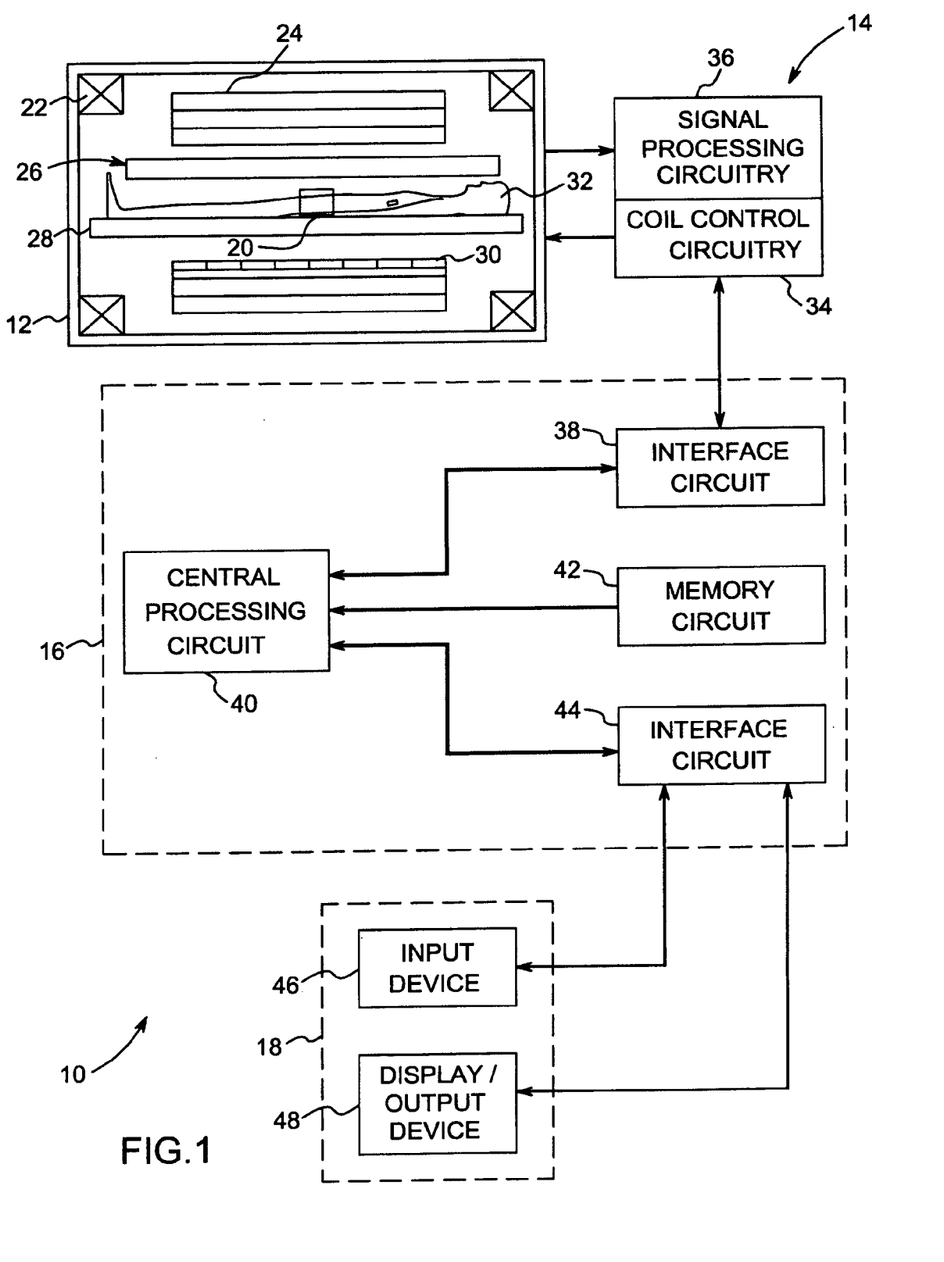
FIG. 1 is a schematic block diagram of an exemplary magnetic resonance imaging (MRI) system suitable for use with the present techniques.

Referring now to FIG. 1, a magnetic resonance system, designated generally by the reference numeral 10, is illustrated as including a magnet assembly 12, control and acquisition circuit 14, system controller circuit 16, and an operator interface station 18. The magnet assembly 12, in turn, includes coil assemblies for selectively generating controlled magnetic fields used to excite gyromagnetic materials spin systems in a subject of interest. In particular, the magnet assembly 12 includes a primary coil 22, which will typically include a super conducting magnet coupled to a cryogenic refrigeration system (not shown). The primary coil 22 generates a highly uniform B0 magnetic field along a longitudinal axis of the magnet assembly. A gradient coil assembly 24, consisting of a series of gradient coils is provided for generating controllable gradient magnetic fields having desired orientations with respect to the subject of interest. In particular, as will be appreciated by those skilled in the art, the gradient coil assembly produces fields in response to pulsed signals for selecting an image slice, orienting the image slice, and encoding excited gyromagnetic material spin systems within the slice to produce the desired image. In specific embodiments as described later, the gradient coil assembly 24 can be removed from the magnet assembly. An RF transmit coil assembly 26, also generally known as a body coil, is provided for producing a controlled radio frequency (RF) field applying excitation signals to the volume of interest 20 that result in MR emissions from the subject that are influenced by the RF fields, and collected for analysis as described below.

A table 28 is positioned within the magnet assembly 12 to support a subject 32. While a full body MRI system is illustrated in the exemplary embodiment of FIG. 1, the technique described below may be equally well applied to various alternative configurations of systems and scanners, including smaller scanners and probes used in MRI applications.

In the embodiment illustrated in FIG. 1, the control and acquisition circuit 14 includes coil control circuitry 34 and signal processing circuit 36. The coil control circuitry 34 receives pulse sequence descriptions from the system controller 16, notably through an interface circuit 38 included in the system controller 16. As will be appreciated by those skilled in the art, such pulse sequence descriptions generally include digitized data defining pulses for exciting the coils of the gradient coil assembly 24 and the transmit coil assembly 26 during excitation and data acquisition phases of operation. The function of the coil control circuitry 34 is described in detail according to aspects of the invention. Fields generated by the transmit coil assembly 26 excite the spin system within the subject 32 to cause emissions from the volume of interest 20. Such emissions are detected by a receiving coil assembly 30 and are filtered, amplified, and transmitted to signal processing circuit 36. Signal processing circuit 36 may perform preliminary processing of the detected signals, such as amplification of the signals. Following such processing, the amplified signals are transmitted to the interface circuit 38 for further processing. It should be noted that the transmit coil assembly 26 may also be used, where desired, in a receive mode according to specific aspects of the invention, to create the resulting MR signals, thereby replacing, at least in certain applications, the need for a separate receive coil assembly.

In addition to the interface circuit 38, the system controller 16 includes central processing circuit 40, memory circuit 42, and interface circuit 44 for communicating with the operator interface station 18. In general, the central processing circuit 40, which will typically include a digital signal processor, a CPU or the like, as well as associated signal processing circuitry, and commands excitation and data acquisition pulse sequences for the magnet assembly 12 and the control and acquisition circuit 14 through the intermediary of the interface circuit 38. The central processing circuit 40 also processes image data received via the interface circuit 38, to perform 2D Fourier transforms to convert the acquired data from the time domain to the frequency domain, and to reconstruct the data into a meaningful image. The memory circuit 42 serves to save such data, as well as pulse sequence descriptions, configuration parameters, and so forth. The interface circuit 44 permits the system controller 16 to receive and transmit configuration parameters, image protocol and command instructions, and so forth.

The operator interface station 18 includes one or more input devices 46, along with one or more display or output devices 48. In a typical application, the input device 46 will include a conventional operator keyboard, or other operator input devices for selecting image types, image slice orientations, configuration parameters, and so forth. The display/output device 48 will typically include a computer monitor for displaying the operator selections, as well as for viewing scanned and reconstructed images. Such devices may also include printers or other peripherals for reproducing hard copies of the reconstructed images.

Figure 2:
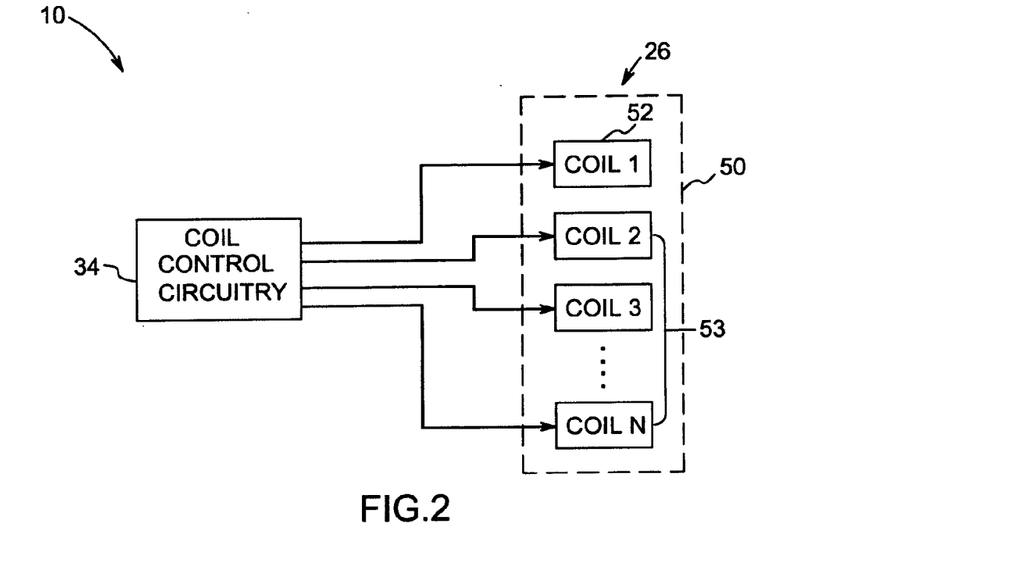
FIG. 2 is a sectional view of the MRI system illustrating the configuration between a coil control circuitry and a transmit coil assembly according to one embodiment of the present technique.

FIG. 2 illustrates a section of the MRI system 10 depicting the transmit coil assembly 26 and the coil control circuitry 34. The transmit coil assembly 26 includes an array 50 of RF coils for producing controlled RF fields applying excitation signals to a volume of interest 20. The coil control circuitry 34 is configured to excite a single coil 52 from the array 50 of RF coils at a given instant of time, and the neighboring coils 53 in the array 50 are deactivated for that particular given instant of time. These neighboring coils are deactivated and decoupled from the active coil using a variety of strategies. For example, the array can be constructed so that each coil has minimal mutual inductance with its immediate neighbors in a fashion well known to those skilled in the art of constructing MR phased-array receive coils.

The array size, in one example, is determined by a field of view for an imaging sequence. Further, each coil 52 of the array 50 is of a size determined by a desired uniformity of excitation. The size of each coil in the array is chosen to be as large as possible to maximize the uniformity of RF excitation in the volume near the coil and small enough to ensure that acceptable levels of RF-induced heat (for example, less than 4° C. temperature rise) are obtained under worse case conditions.

Figure 3:
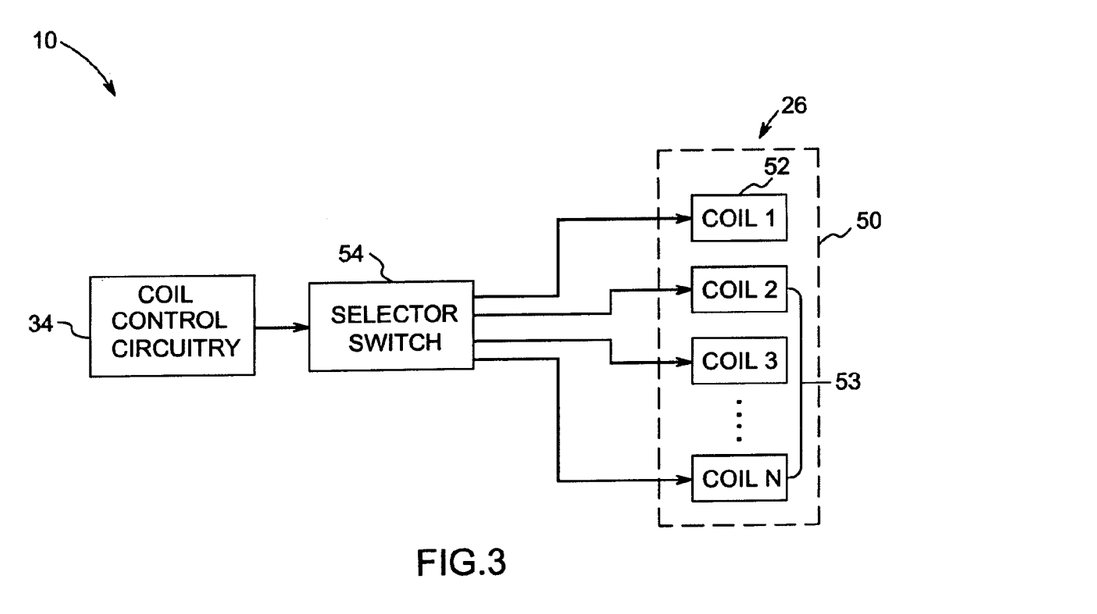
FIG. 3 is a sectional view of the MRI system illustrating the configuration between the coil control circuitry, the transmit coil assembly and a selector switch according to a second embodiment of the present technique.

The coil control circuitry 34, in a specific embodiment as also shown in FIG. 3, includes a selector switch 54 for activating the single coil 52 from the array at the given instant of time. The selector switch 54 activates the single coil 52 closest to the volume of interest 20. In one example, the selector switch 54 automatically activates one coil at a time as a patient 32 moves into and out of a magnet assembly. Alternatively, in another example, the selector switch 54 may be mechanical in construction. The single coil 52, which is the active coil, is selected in real-time to be the coil best suited for imaging the area or volume of interest. As explained hereinabove, this selection can be made in response to changes in the scan plane offset within the total imaging volume of the magnet, or alternately, it can be made in response to patient bed motion so that the coil closest to the magnet iso-center is always active as the patient bed moves through the magnet.

The coil control circuitry 34, in a specific embodiment, is also configured to synchronize coil excitation with a pulse sequence, where each coil of the array is excited in a sequential manner. The coil control circuitry 34, in another specific embodiment, is configured to synchronize coil excitation with a pulse sequence, where each coil of the array is excited in an interleaved manner.

In an alternate embodiment, the array 50 of RF coils can serve as both transmit and receive coils. If these coils are to be used for both functions, then an additional switch, a transmit/receive (T/R) switch 56 may be employed for rapidly reconfiguring each of the coils of the array 50 between transmit and receive states.

Figure 4:
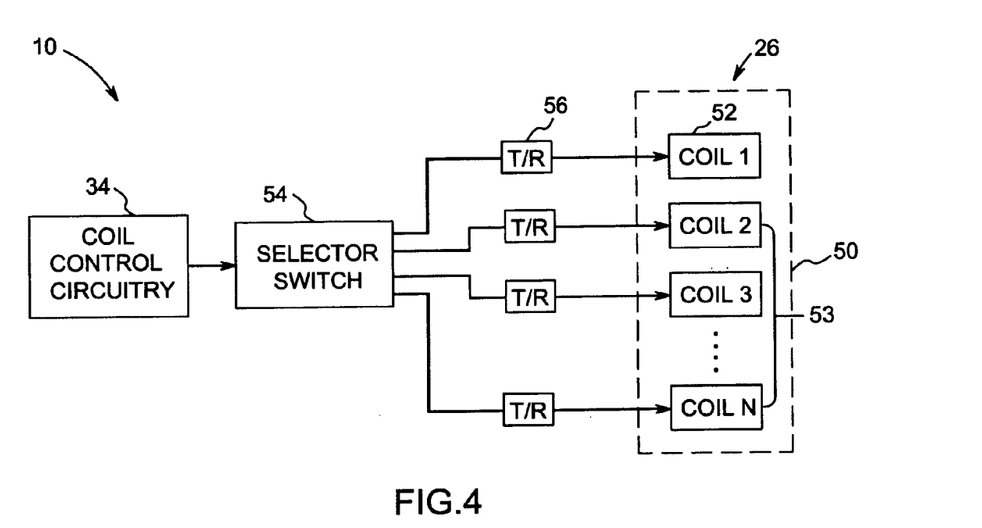
FIG. 4 is a sectional view of the MRI system illustrating the configuration between the coil control circuitry, the transmit coil assembly, the selector switch and a transmit/receive (T/R) switch according to a third embodiment of the present technique.

FIG. 4 illustrates an embodiment wherein the array 50 of the RF coils is used for both transmit and receive modes, through a plurality of transmit/receive switches 56, each transmit/receive switch being coupled to a respective coil of the array 50 of radio frequency coil.

Figure 5:
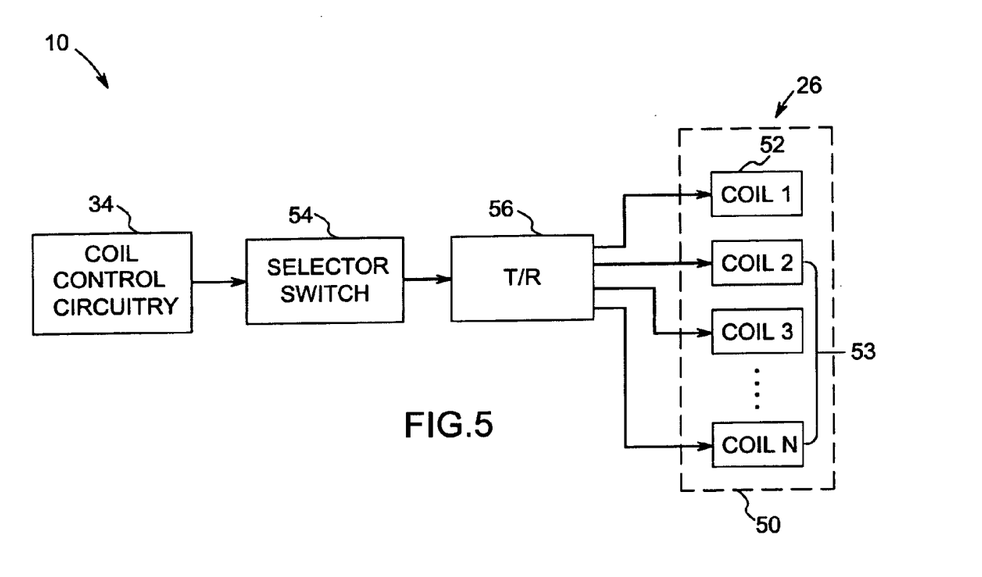
FIG. 5 is a sectional view of the MRI system illustrating the configuration between the coil control circuitry, the transmit coil assembly, the selector switch and the T/R switch according to a fourth embodiment of the present technique.
Figure 6:
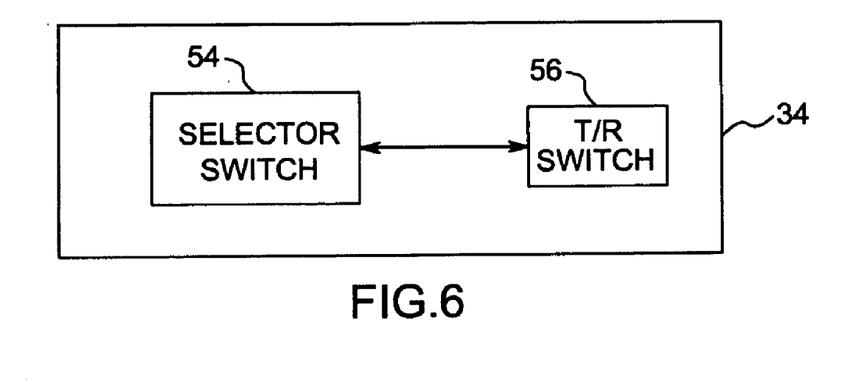
FIG. 6 is a sectional view of the MRI system illustrating the configuration between of the coil control circuitry to a fifth embodiment of the present technique.

In an alternative embodiment, as shown by FIG. 5, a single transmit/receive switch is used between the MRI scanner electronics and the selector switch. Transmit/receive switches are well known to those skilled in the art but have not been employed as shown. As would be appreciated by those skilled in the art, the selector switch 54 and the T/R switch 56 may be incorporated in the coil control circuitry itself as depicted generally in FIG. 6.

Figure 7:
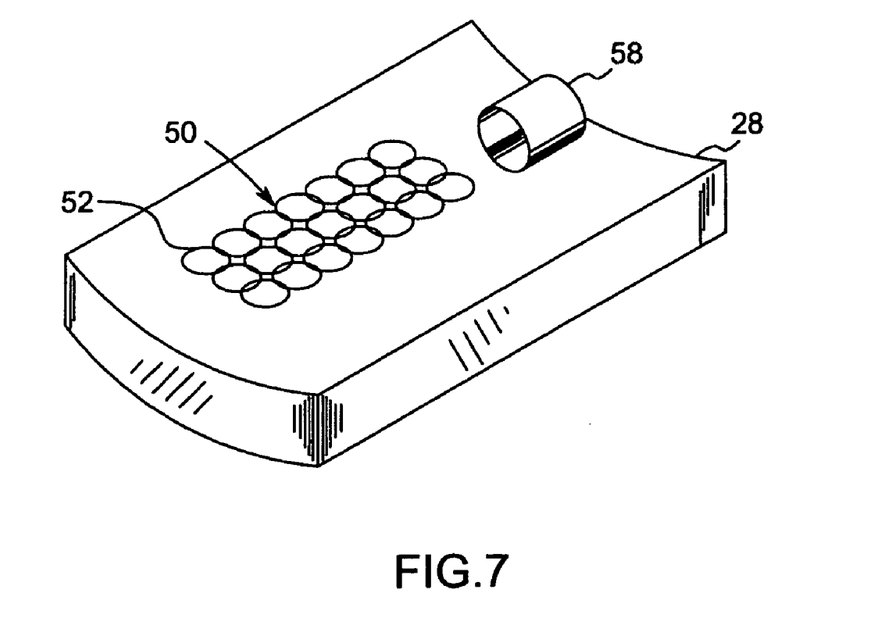
FIG. 7 is a diagrammatic view of a patient table and arrangement of RF coils in the MRI system.

In another specific embodiment as shown in FIG. 7, the MRI system 10 includes an array 52 of RF coils, wherein the array of coils is incorporated into a patient bed 28. FIG. 7 shows an embodiment that is useful for vascular interventions in the head and neck. In this embodiment a series of flat loop coils are incorporated into the patient bed along with a quadrature birdcage coil 58 for high-quality imaging of the head. The flat loop coils are positioned to cover the entire body from the femoral arteries (where guidewires and catheters are typically introduced) to the carotid arteries. These arrangements provide suitable image quality for visualization of the patient's aorta and provide a means for tracking an interventional device as it is advanced up the aorta to the carotid arteries. Once the devices are in the carotid arteries, however, imaging and tracking functions are performed using a birdcage coil which provides an optimal signal-to-noise ratio (SNR) and a uniform RF field.

Figure 8:
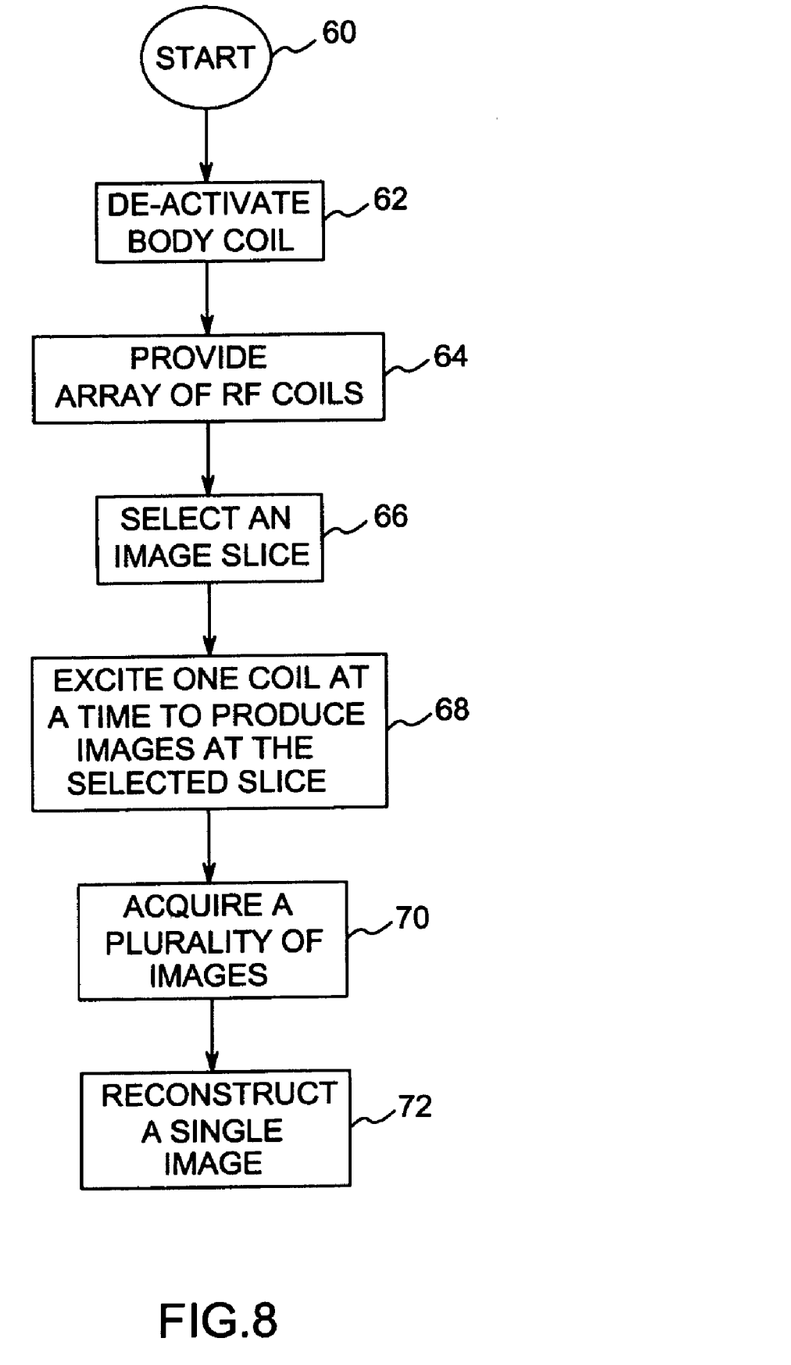
FIG. 8 is a flowchart illustrating a method of reducing RF induced heating during interventional MR procedures for use in different embodiments according to aspects of present technique.

Another aspect of the invention is a method for reducing RF-induced heating during interventional MRI procedures and is illustrated in the flowchart as shown in FIG. 8. The method starts at step 60 and includes the step 62 for de-activating a body coil during the MRI procedure. In a specific embodiment, the body coil may not be present at all or alternately it may be permanently removed to prevent accidental activation during an MRI procedure. One skilled in the art will realize that his has the added benefit of increasing the bore diameter. Next step 64 includes using an array 50 of RF coils for producing controlled RF field applying excitation signals to a volume of interest 20. Next, an imaging slice is selected at step 66, within a volume of interest 20 being imaged. In one example, the RF coil selection is synchronized with the pulse sequence. In such an approach, an imaging slice is first selected by the operator. A plurality of images is then acquired at step 70 at the selected image slice by exciting each coil in the array at step 68. A single coil in the array is excited at a given instant of time and produces a single image. For example, a first image is obtained using excitation from the first coil. A second image is then acquired using excitation from a second coil and so on until images from all desired coils are collected. Subsequently, the plurality of images are reconstructed into a reconstructed image at step 72, where the reconstructed image has a larger field-of-view than the single image from the single coil.

This approach can be applied in a sequential fashion as described above, or alternatively, in an interleaved fashion in which, as would be appreciated by those skilled in the art, selected subsets of k-space (e.g. a single line) are queried using one coil, followed by the second, and so on until data from all coils have been collected. The next selected subset of k-space is then queried in the same fashion and so on until data from all of k-space as been acquired for all transmit coils. Since the electromagnetic field (E-field) generated by a smaller transmit coil is limited in both amplitude and extent, RF-induced heating associated with the presence of conducting devices such as guidewires, cables and the like is greatly reduced.

The above described embodiments present a variety of ways of using the transmit array of radio frequency coils, in which multiple coil geometries are used, each optimized for the anatomy near the coil. As it would be appreciated by those skilled in the art, these individual coils can be ganged together for larger coverage during imaging procedures not employing conducting invasive devices.

It should also be appreciated by those skilled in the art that invention as described in different embodiments hereinabove is distinct from existing MR phased-array receive coils in that only a subset of the RF coils is active at any given instant in time. In a specific example only a single coil is activated at any given instance of time. This subset of coils (or the single coil) creates the excitation RF field for MR scanning (and optionally acts as a receive coil). Traditionally an MRI phased-array receive coil, on the other hand, has a plurality of active receive coils that are simultaneously active and relies on an large external RF coil (typically the body coil) to create the RF excitation. The use of a large transmit coil creates the potential for the generation of unacceptable levels of RF-induced heating whenever long conducting structures are present near or in the subject.

Extremely low levels of RF-induced heating during interventional MR procedures will be afforded via an MRI system described in the above embodiments. Furthermore, the MRI system will be more open and acoustically quieter, particularly when the body coil and RF shield are permanently removed. The system will also simplify the development of MRI interventional devices since no special steps or features to prevent RF-induced heating will be required.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A magnetic resonance imaging system comprising:
an array of radio frequency (RF) coils for producing controlled radio frequency fields applying excitation signals to a volume of interest; and
a coil control circuitry configured to excite a single coil from the array of radio frequency coils at a given instant of time, wherein neighboring coils in the array are deactivated for the given instant of time.

2. The imaging system of claim 1, wherein the array is of a size determined by a field of view for an imaging sequence.

3. The imaging system of claim 1, wherein each coil of the array is of a size determined by a desired uniformity of excitation.

4. The imaging system of claim 1, wherein the coil control circuitry comprises a selector switch for activating the single coil from the array at the given instant of time.

5. The imaging system of claim 4, wherein the selector switch activates the single coil closest to the volume of interest.

6. The imaging system of claim 5, wherein the selector switch automatically activates one coil at a time as a patient moves into and out of a magnet assembly.

7. The imaging system of claim 5, wherein the selector switch is mechanical.

8. The imaging system of claim 1, wherein the coil control circuitry is configured to synchronize coil excitation with a pulse sequence, wherein each coil of the array is excited in a sequential manner.

9. The imaging system of claim 1, wherein the coil control circuitry is configured to synchronize coil excitation with a pulse sequence, wherein each coil of the array is excited in an interleaved manner.

10. The imaging system of claim 1, wherein the coil control circuitry comprises a transmit/receive switch for reconfiguring each of the coils of the array between transmit and receive states.

11. The imaging system of claim 1 further comprising a plurality of transmit/receive switches, each transmit/receive switch being coupled to a respective coil of the array of radio frequency coil, wherein each transmit/receive switch reconfigures the respective coil between transmit and receive states.

12. The imaging system of claim 1, wherein the coil control circuitry comprises a selector switch for activating a subset of coils from the array at the given instant of time.

13. The imaging system of claim 12, wherein the selector switch activates the subset of coils closest to the volume of interest.

14. The imaging system of claim 13, wherein the selector switch (automatically activates one subset of coils at a time as a patient moves into and out of a magnet assembly.

15. A magnetic resonance imaging system comprising:
an array of radio frequency coils for producing controlled radio frequency fields applying excitation signals to a volume of interest;
at least one detecting coil for detecting magnetic resonance signals resulting from the excitation signals;
a coil control circuitry configured to energize the array of radio frequency coil and to obtain an image from the magnetic resonance signals detected by the at least one detecting coil; and
a selector switch coupled to the coil control circuitry, wherein the selector switch is configured to activate a single coil from the array of radio frequency coils at a given instant of time, and wherein neighboring coils in the array are deactivated and decoupled for the given instant of time.

16. The imaging system of claim 15 further comprising a transmit/receive switch coupled to the coil control circuitry and to the selector switch, wherein the transmit/receive switch reconfigures between transmit and receive states for each coil.

17. The imaging system of claim 15 further comprising a plurality of transmit/receive switches, each transmit/receive switch coupled to a respective coil of the array of radio frequency coil, wherein each transmit/receive switch reconfigures the respective coil between transmit and receive states.

18. The imaging system of claim 15, wherein the selector switch activates the single coil closest to the volume of interest.

19. The imaging system of claim 15, wherein the selector switch automatically activates one coil at a time as a patient moves into and out of a magnet assembly.

20. A magnetic resonance imaging system comprising:
an array of radio frequency coils for producing controlled radio frequency fields applying excitation signals to a volume of interest, wherein the array of coils is incorporated into a patient bed;
at least one detecting coil for detecting magnetic resonance signals resulting from the excitation signals;
a coil control circuitry configured to energize the array of radio frequency coils and to obtain an image from the magnetic resonance signals detected by the at least one detecting coil; and
a selector switch coupled to the control circuitry, wherein the selector switch is configured to activate a single coil from the array of radio frequency coils at a given instant of time, and wherein neighboring coils in the array are deactivated and decoupled for the given instant of time.

21. The imaging system of claim 20, wherein the array is of a size determined by a field of view for an imaging sequence.

22. The imaging system of claim 20, wherein each coil of the array is of a size determined by a desired uniformity of excitation.

23. The imaging system of claim 20 further comprising a transmit/receive switch coupled to the coil control circuitry and to the selector switch, wherein the transmit/receive switch reconfigures between transmit and receive states for each coil.

24. The imaging system of claim 20 further comprising a plurality of transmit/receive switches, each transmit/receive switch coupled to a respective coil of the array of radio frequency coil, wherein each transmit/receive switch reconfigures the respective coil between transmit and receive states.

25. The imaging system of claim 20, wherein the selector switch activates the single coil (52) closest to the volume of interest.

26. The imaging system of claim 20, wherein the selector switch automatically activates one coil at a time as the patient bed moves into and out of a magnet assembly.

27. A method for reducing radio frequency induced heating during interventional MRI procedures, the method comprising:
　de-activating a body coil during the MRI procedure;
　providing an array of radio frequency coils for producing controlled radio frequency fields applying excitation signals to a volume of interest;
　selecting an imaging slice within a volume of interest being imaged;
　acquiring a plurality of images at the selected image slice by exciting each coil in the array, wherein a single coil is excited at a given instant of time and produces a single image; and
　reconstructing the plurality of images into a reconstructed image, wherein the reconstructed image has a larger field-of-view than the single image from the single coil.

28. The method of claim 27, wherein excitation of coils in the array is synchronized with a pulse sequence.

29. The method of claim 27, wherein the coils in the array are excited in a sequential manner.

30. The method of claim 27, wherein the coils in the array are excited in an interleaved manner.

31. The method of claim 27, wherein excitation of the coils in the array is achieved by employing a selector switch for exciting a single coil from the array of radio frequency coils at a given instant of time, and wherein neighboring coils in the array are deactivated for the given instant of time.

32. The method of claim 27 further comprising reconfiguring the coils in the array between transmit and receive states by using a transmit/receive switch.

33. A method for reducing radio frequency induced heating during interventional MR procedures, the method comprising:
　providing an array of radio frequency coils for producing controlled radio frequency fields applying excitation signals to a volume of interest;
　selecting an imaging slice within a volume of interest being imaged;
　acquiring a plurality of images at the selected image slice by exciting each coil in the array, wherein a single coil is excited at a given instant of time and produces a single image and wherein neighboring coils are deactivated at the given instant of time; and
　reconstructing the plurality of images into a reconstructed image, wherein the reconstructed image has a larger field-of-view than the single image from the single coil.

34. The method of claim 33, wherein excitation of coils in the array is synchronized with a pulse sequence.

35. The method of claim 33, wherein excitation of the coils in the array is achieved by employing a selector switch for exciting a single coil from the array of radio frequency coils at a given instant of time, and wherein neighboring coils in the array are deactivated for the given instant of time.

36. The method of claim 33 further comprising reconfiguring the coils in the array between transmit and receive states by using a transmit/receive switch.

\* \* \* \* \*